(12) United States Patent
Oh et al.

(10) Patent No.: US 9,515,084 B2
(45) Date of Patent: Dec. 6, 2016

(54) 3D NONVOLATILE MEMORY DEVICE HAVING COMMON WORD LINE

(71) Applicant: SK hynix Inc., Gyeonggi-do (KR)

(72) Inventors: Sung Lae Oh, Chungcheongbuk-do (KR); Jin Ho Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/667,397

(22) Filed: Mar. 24, 2015

(65) Prior Publication Data

US 2016/0111361 A1    Apr. 21, 2016

(30) Foreign Application Priority Data

Oct. 17, 2014 (KR) .................. 10-2014-0140715

(51) Int. Cl.
| H01L 23/52 | (2006.01) |
| H01L 27/11 | (2006.01) |
| H01L 21/76 | (2006.01) |
| H01L 21/32 | (2006.01) |
| H01L 27/115 | (2006.01) |
| H01L 21/768 | (2006.01) |
| H01L 21/3213 | (2006.01) |

(52) U.S. Cl.
CPC ... *H01L 27/11578* (2013.01); *H01L 21/32139* (2013.01); *H01L 21/768* (2013.01); *H01L 27/11548* (2013.01); *H01L 27/11575* (2013.01); *H01L 27/11556* (2013.01); *H01L 27/11582* (2013.01)

(58) Field of Classification Search
CPC .......... H01L 23/528; H01L 27/11573; H01L 27/11526; H01L 21/768; H01L 27/11551; H01L 27/11578; H01L 21/32139
USPC ........................................................ 257/390
See application file for complete search history.

(56) References Cited

U.S. PATENT DOCUMENTS

| 2007/0252201 | A1* | 11/2007 | Kito | ..................... H01L 21/8221 257/331 |
| 2013/0161821 | A1* | 6/2013 | Hwang | ............... H01L 23/5283 257/773 |
| 2015/0279852 | A1* | 10/2015 | Mizutani | ........... H01L 27/11556 257/315 |
| 2015/0380418 | A1* | 12/2015 | Zhang | ............... H01L 27/11529 257/326 |

FOREIGN PATENT DOCUMENTS

| KR | 1020090099486 | 9/2009 |
| KR | 101102548 | 1/2012 |

* cited by examiner

*Primary Examiner* — John C Ingham
*Assistant Examiner* — Didarul Mazumder
(74) *Attorney, Agent, or Firm* — IP & T Group LLP

(57) ABSTRACT

A 3D nonvolatile memory device including memory cells vertically stacked is disclosed. Word lines are integrally formed to be elongated over adjacent cell regions spaced apart from each other, and portions of the word lines between the cell regions are partially etched in a stepped shape to form word line contact regions.

12 Claims, 13 Drawing Sheets

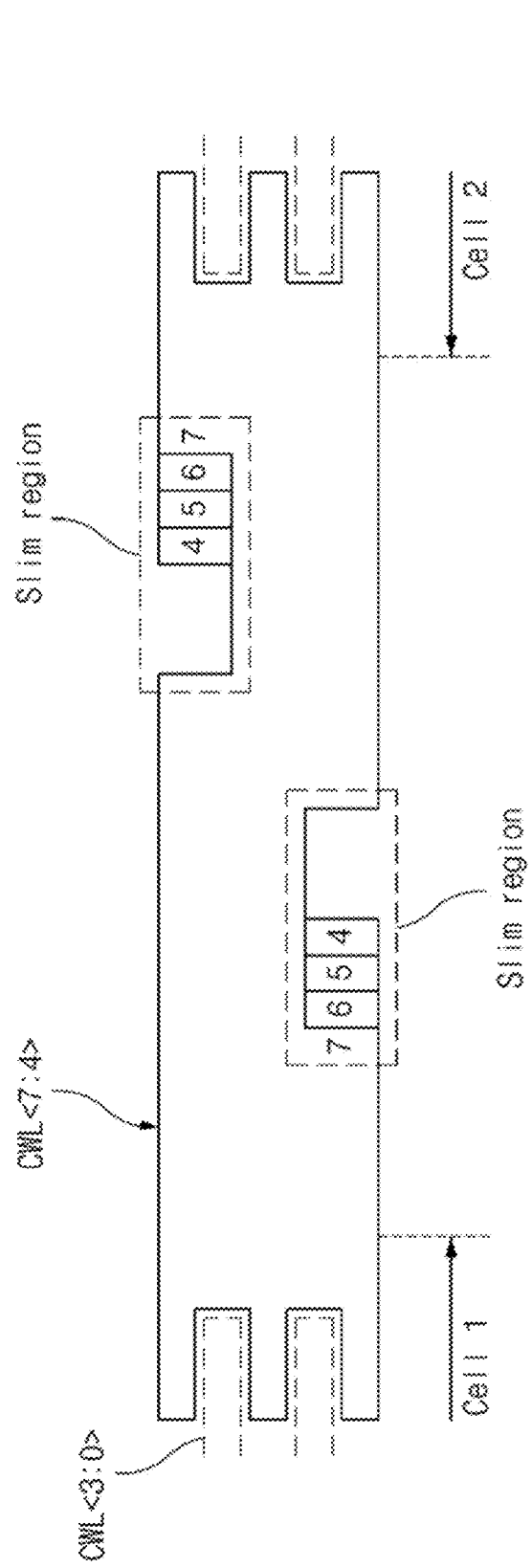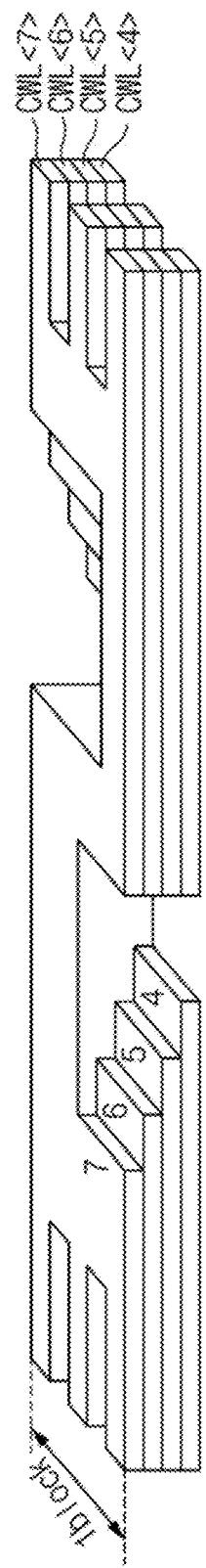
FIG.2A
FIG.2B

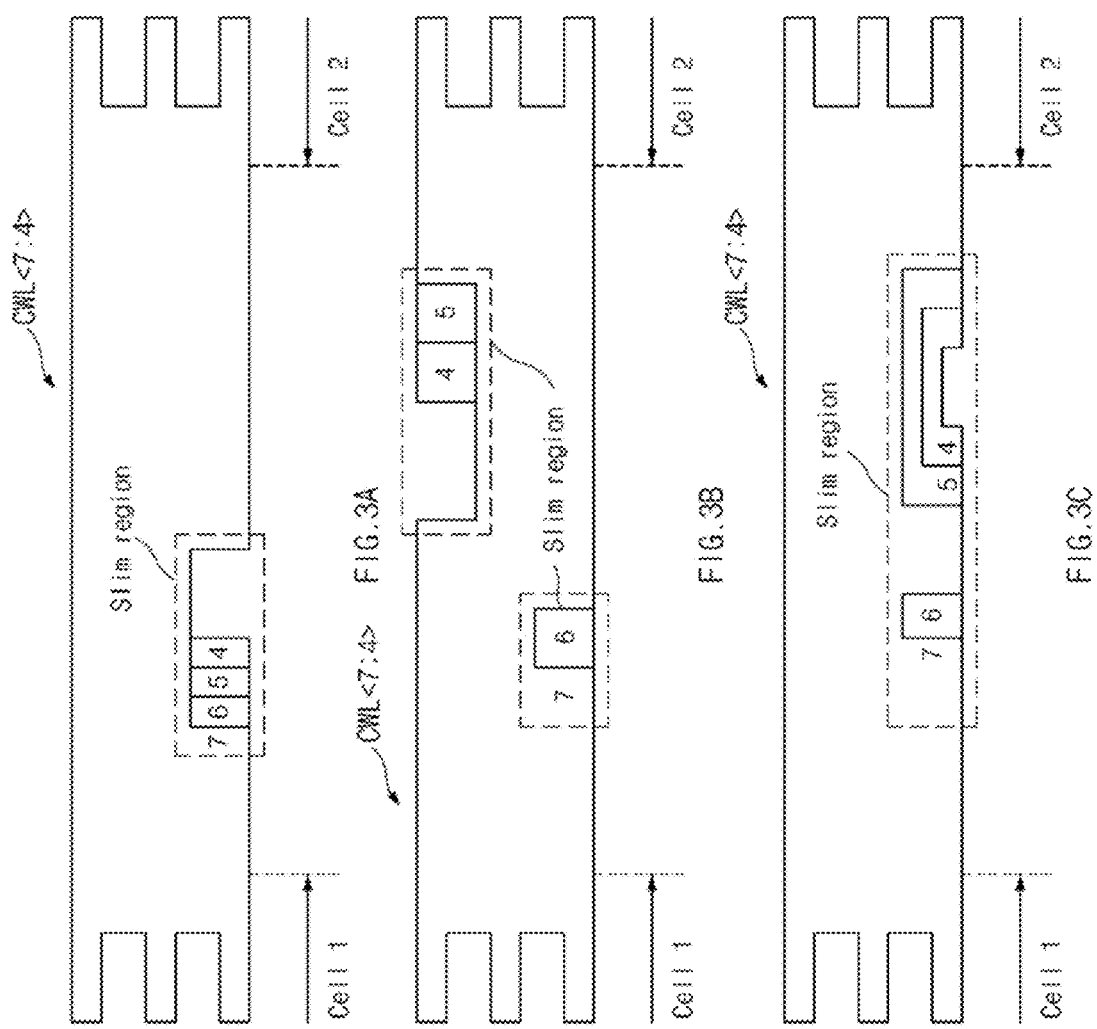

3D NONVOLATILE MEMORY DEVICE HAVING COMMON WORD LINE

CROSS-REFERENCES TO RELATED APPLICATION

The present application claims priority to Korean patent application 10-2014-0140715, filed on Oct. 17, 2014, which is incorporated herein by reference in its entirety.

BACKGROUND OF THE INVENTION

1. Technical Field

Embodiments relate to a three-dimensional (3D) nonvolatile memory device, and more particularly, to a 3D nonvolatile memory device with stacked word lines which are integrally formed, spaced apart by a given distance, and elongated over adjacent cell regions.

2. Related Art

Nonvolatile semiconductor memory devices are memory devices in which stored data is retained even when power is interrupted. Currently, various nonvolatile memory devices such as, flash memory devices and the like have been widely used.

The flash memory devices are characterized by data programming and erasing being electrically performed. The flash memory device includes a plurality of blocks having memory cells, and each of the blocks includes a plurality of pages. In particular, erasing data, which is stored in the memory cells, is performed on a block.

Currently, as a degree of integration in 2D nonvolatile memory devices in which memory cells are two-dimensionally formed on a semiconductor substrate reaches its limit, 3D nonvolatile memory devices having a channel layer which is vertically protruding from a semiconductor substrate have been proposed.

3D nonvolatile memory devices are typically classified into devices having a line type channel layer and devices having a U-shaped channel layer. In the 3D nonvolatile memory devices having the line type channel layer, bit lines and source lines are arranged over and under stacked memory cells. In the 3D nonvolatile memory devices having the U-shaped channel layer, both the bit lines and source lines are arranged over the stacked memory cells. The 3D nonvolatile memory devices having a line type channel layer are advantageous in terms of the degree of integration since only a single-layered select gate is necessary.

FIG. 1 a schematic view illustrating a configuration of a conventional 3D nonvolatile memory device. FIG. 1 illustrates a connection relationship between word lines of cell regions and pass transistors.

Each of cell regions Cell1 and Cell 2 has a 3D structure in which word lines WL are vertically stacked. Pass transistors Pass Tr of an X-decoder, which supply programming voltages to the word lines WL of the cell regions Cell1 and Cell2, are formed in a pass transistor region between the cell regions Cell1 and Cell2. The word lines WL of the cell regions Cell1 and Cell2 are coupled to the pass transistors Pass Tr through local word lines LWL and receive the programming voltages from the pass transistors Pass Tr.

End portions of the word lines WL between the cell regions Cell1 and Cell 2 and the pass transistor region are etched in a stepped type to form a slim region. The slim region is coupled to the local word lines LWL through contacts.

Gates of the pass transistors Pass Tr are coupled to a block word line BLKWL to which a block selection signal is applied. The pass transistors Pass Tr couple the global word lines GWL and the local word lines LWL according to the block selection signal. That is, the pass transistors Pass Tr transfer programming voltages received from the global word lines GWL to the word lines WL of the cell regions Cell1 and Cell2 through the local word lines LWL according to the block selection signal.

In conventional 3D nonvolatile memory devices, the local word lines LWL for coupling the word lines WL and the pass transistors Pass Tr are necessary. However, since the word lines WL are formed in a stacking structure, it becomes difficult to form a large number of metal interconnections LWL in a limited space such as, the pass transistor region. That is, the number of metal interconnections LWL for coupling the word lines WL and the pass transistors Pass Tr increases in proportion to an increase of the number of layers of the word lines. However, since a pitch of the cell block is not increased, a difficulty level for forming the metal interconnections increases.

In particular, it is difficult to ensure sufficient area for the pass transistor region in which one pass transistor Pass Tr is commonly coupled to the word lines of the cell regions Cell1 and Cell2 at both sides thereof.

SUMMARY

One or more exemplary embodiments are directed to improving a process margin of a 3D nonvolatile memory device by improving a structure of a word line in the 3D nonvolatile memory device.

According to an aspect of an exemplary embodiment, there is provided a three-dimensional (3D) nonvolatile memory device. The 3D nonvolatile memory device may include a first cell region, a second cell region spaced apart from the first cell region, and a stack of common word lines extending from the first cell region and the second cell region, wherein the stack of common word lines includes N number of common word lines, where N is an integer.

According to an aspect of an exemplary embodiment, there is provided a method of fabricating a three-dimensional (3D) nonvolatile memory device. The method may include forming a stack structure including N number of conductive layers, formed over a semiconductor substrate, wherein the semiconductor substrate includes a first cell region, a second cell region spaced apart from the first cell region, and a pass transistor region between the first cell region and the second cell region, wherein the stack structure extends from the first cell region through the pass transistor region to the second cell region, wherein N is an integer, forming an etch stop layer over the stack structure, defining a slim region by removing the etch stop layer located in the pass transistor region, forming a photoresist pattern over the slim region and the etch stop layer to expose a first region of the $N^{th}$ conductive layer in the slim region, performing selective primary etching against the exposed first region of the $N^{th}$ conductive layer using the photoresist pattern to expose a first region of the $N-1^{th}$ conductive layer, slimming the photoresist pattern to expose a second region of the $N^{th}$ conductive layer, and performing secondary etching against the exposed first region of the $N-1^{th}$ conductive layer and the exposed second region of the $N^{th}$ conductive layer using the slimmed photoresist pattern, to expose a first region of the $N-2^{th}$ conductive layer and to exposed a second region of the $N-1^{th}$ conductive layer, respectively, wherein the second region of the $N-1^{th}$ conductive layer, and the first region of the N-2$^{th}$ conductive layer form a stepped structure in the slim region, where N is an integer.

Word lines and pass transistors may be easily coupled in the 3D nonvolatile memory devices even when the number of layers of the word lines is increased.

These and other features, aspects, and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which:

FIG. 2A and FIG. 2B are schematic views illustrating a configuration of common word lines according to an embodiment of the inventive concept;

FIGS. 3A to 3C are plan views illustrating configurations of common word lines according to other embodiments of the inventive concept;

DETAILED DESCRIPTION

Figure 1A:
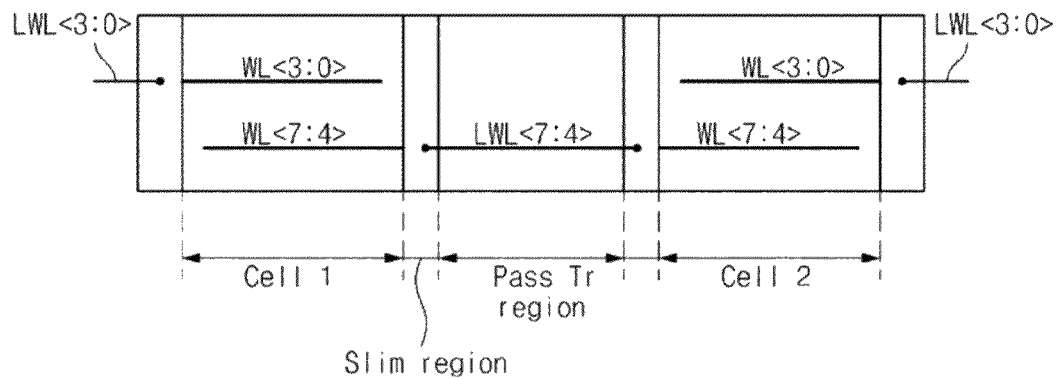
FIG. 1A and FIG. 1B are schematic views illustrating a configuration of a conventional 3D nonvolatile memory device.

Hereinafter, exemplary embodiments will be described in greater detail with reference to the accompanying drawings. Like reference numerals in the drawings denote like elements, and overlapping descriptions for the same elements will be omitted.

The inventive concept is described herein with reference to cross-section and/or plan illustrations that are schematic illustrations of idealized embodiments of the inventive concept. However, embodiments of the inventive concept should not be construed as limited to the inventive concept. Although a few embodiments of the inventive concept will be shown and described, it will be appreciated by those of ordinary skill in the art that changes may be made in these exemplary embodiments without departing from the principles and spirit of the inventive concept. Functions or operations described in specific blocks may be performed in an order different from the order described in a flowchart when some embodiments are differently implemented. For example, two continuous blocks may be substantially simultaneously performed, or the blocks may be reversely performed according to related functions or operations.

FIG. 2A is a plan view and FIG. 2B is a perspective view schematically illustrating a configuration of common word lines according to an embodiment of the inventive concept.

A 3D nonvolatile memory device according to the embodiment includes a common word line CWL. The common word line CWL may be a stack of a plurality of common word lines. The number of the common word lines in the stack may be N, where N is an integer. For example, N is 8 and plurality of common word lines may include CWL<7>, CWL<6>, CWL<5>, CWL<4>, . . . , CWL<0>.

The common word lines extend from a cell region Cell1 to a cell region Cell 2. One or more slim regions may be defined between the cell region Cell1 and the cell region Cell 2. More specifically, the common word lines may extend from the cell region Cell1 through the slim region to the cell region Cell 2.

Under this structure, programming voltage is simultaneously received from adjacent cell regions Cell1 and Cell2. That is, each of the common word lines in the cell region Cell1 and the cell regions Cell 2 is not physically divided but is formed as a single body.

Figure 1B:
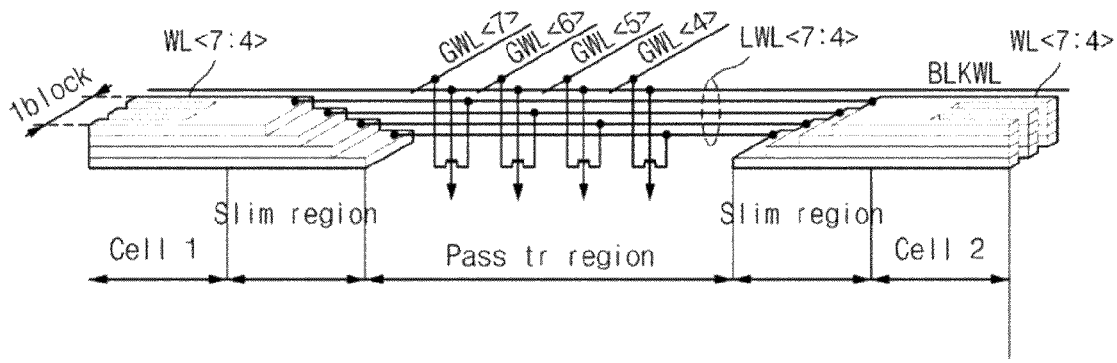

In the conventional art, as illustrated in FIG. 1A and FIG. 1B, the word lines or word line stacks of Cell1 and word lines or word line stacks in Cell2 are separately formed from each other. The word lines WL<7:4> of the cell region Cell1 are physically separated from the word lines WL<7:4> of the cell region Cell2. The word lines WL<7:4> of the cell regions Cell1 and Cell2 are coupled to the pass transistors Pass Tr through separate metal interconnections LWL<7:4>.

In the embodiment illustrated in FIG. 2A and FIG. 2B, integrated common word lines CWL<7:4> are formed. The common word lines extend from the cell region Cell1 to the cell region Cell2. The common word lines CWL<7:4> in the embodiment perform the function that the conventional local word lines LWL did.

Slim regions may be defined between the cell regions Cell1 and Cell2 by partially etching the common word lines CWL in a stepped manner. The etched location is referred to as the slim region. The slim region is also referred to as word line contact region. That is, word line contact regions or the slim regions, for coupling the common word lines CWL<7:4> to the pass transistors are formed in the common word lines CWL<7:4> between the cell regions Cell1 and Cell2.

In an embodiment, two slim regions may be formed in the common word lines CWL<7:4> between the cell region Cell1 and the cell region Cell2, as illustrated in FIG. 2A and FIG. 2B. One slim region may be formed adjacent to the cell region Cell1 and the other slim region may be formed adjacent to the cell region Cell2. One slim region may be formed on a first sidewall of the common word lines CWL and the other slim region may be formed on a second sidewall of common word lines CWL. The second sidewall is the opposite sidewall to the first sidewall.

FIGS. 3A to 3C are plan views illustrating configurations of common word lines according to embodiments of the inventive concept.

As illustrated in FIG. 3A, only one slim region is provided between the cell region Cell1 and the cell region Cell2. For example, the slim region may be formed on the first sidewall of common word lines CWL<7:4>. In the slim region, each step in FIG. 3A is larger in size than each step in the slim region of FIG. 2A and FIG. 2B.

In FIG. 2A and FIG. 2B, each slim region exposes all individual word lines of the common word line CWL<7:4>. The common word lines may be divided, and the slim regions partially expose the common word lines CWL<7:4>. For example, as illustrated in FIG. 3B, two slim regions may be formed. One slim region exposes a portion of the common word lines CWL<7:4>, for example, the common word line CWL<6>, and the other slim region exposes the other common word lines CWL<5:4>.

In another embodiment, as illustrated in FIG. 3C, two slim regions may be formed on the same sidewall of the common word lines CWL<7:4>. In FIG. 3C, the two slim regions have different shape from each other.

The locations and shapes of the slim regions illustrated in FIG. 2A, FIG. 2B and FIGS. 3A to 3C are merely illustrative. In the illustrated slim region, the common word lines CWL<7:4> are coupled to the pass transistors, however, the locations and shapes of the slim regions are not limited to this embodiment.

Figure 4A:
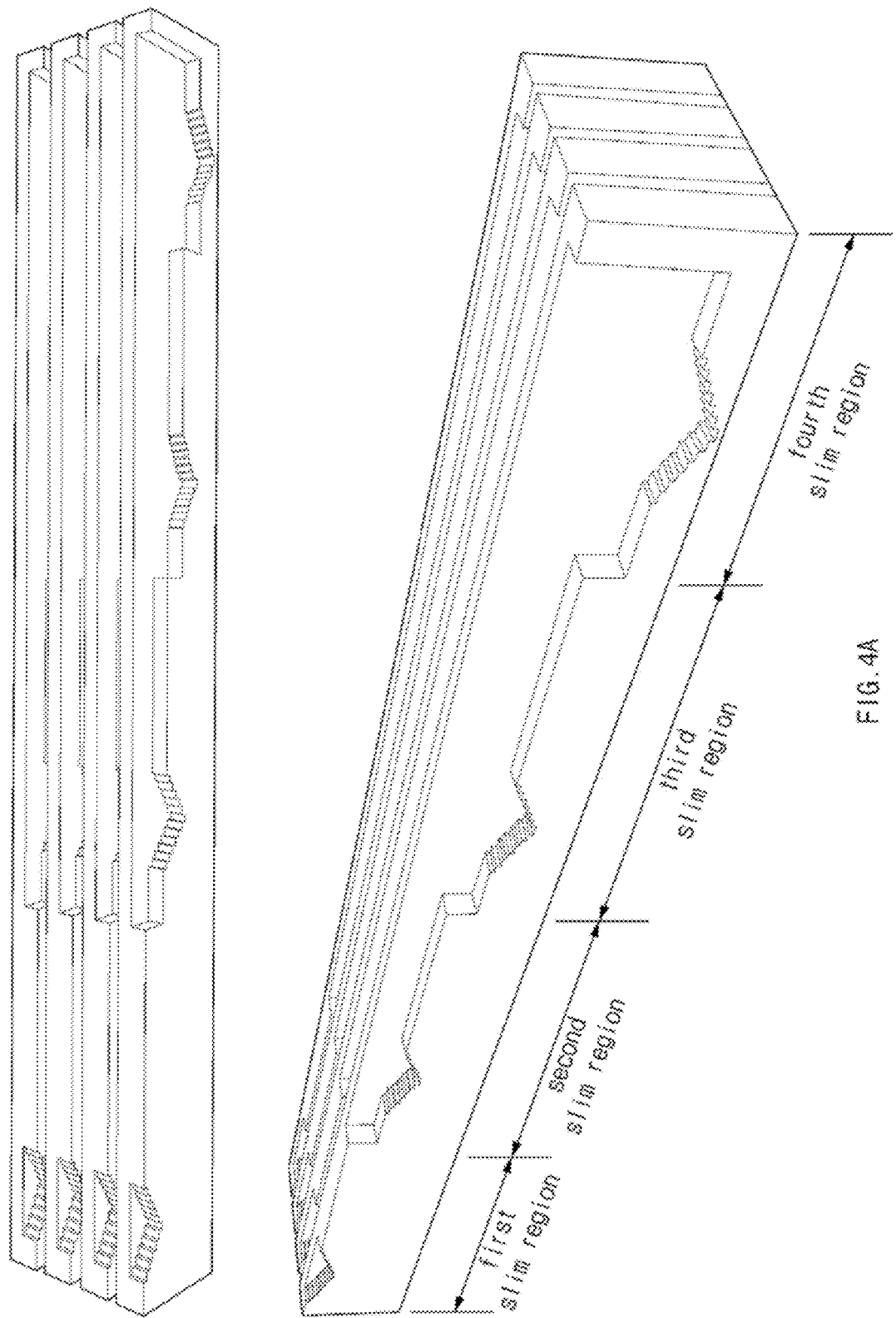
FIGS. 4A to 4C are perspective views illustrating configurations of common word lines according to other embodiments of the inventive concept.
Figure 4B:
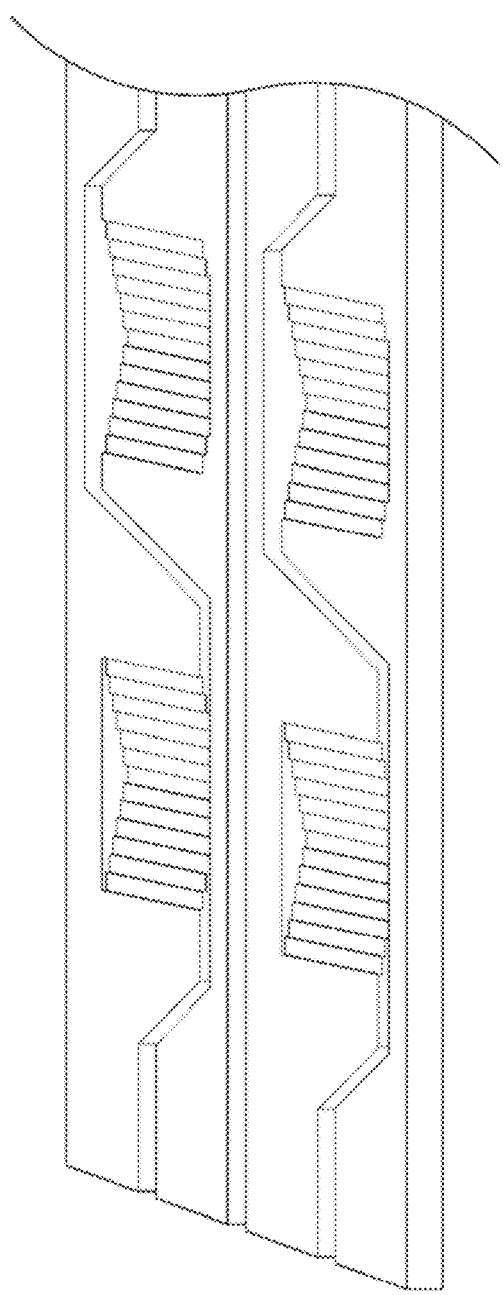
Figure 4C:
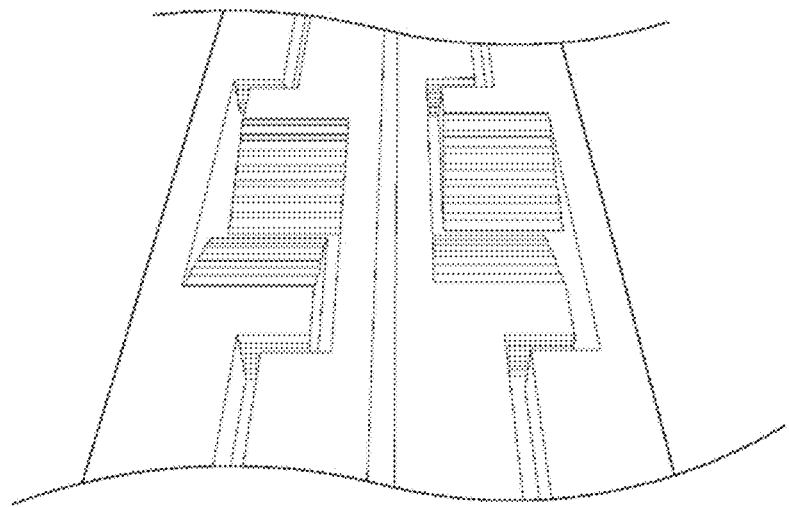

FIGS. 4A to 4C are perspective views illustrating configurations of common word lines according to another embodiment of the inventive concept. For simplicity, only slim regions are illustrated in FIGS. 4A to 4C.

In FIG. 4A, a stack of common word lines CWL includes a plurality of common word lines, and three or more slim regions are formed on the same side of the stack of common word lines CWL.

In FIG. 4B, slim regions are formed in such a manner that common word lines have step shapes facing to each other. In FIG. 4C, the slim regions are symmetrically formed to face each other in adjacent blocks.

Figure 5:
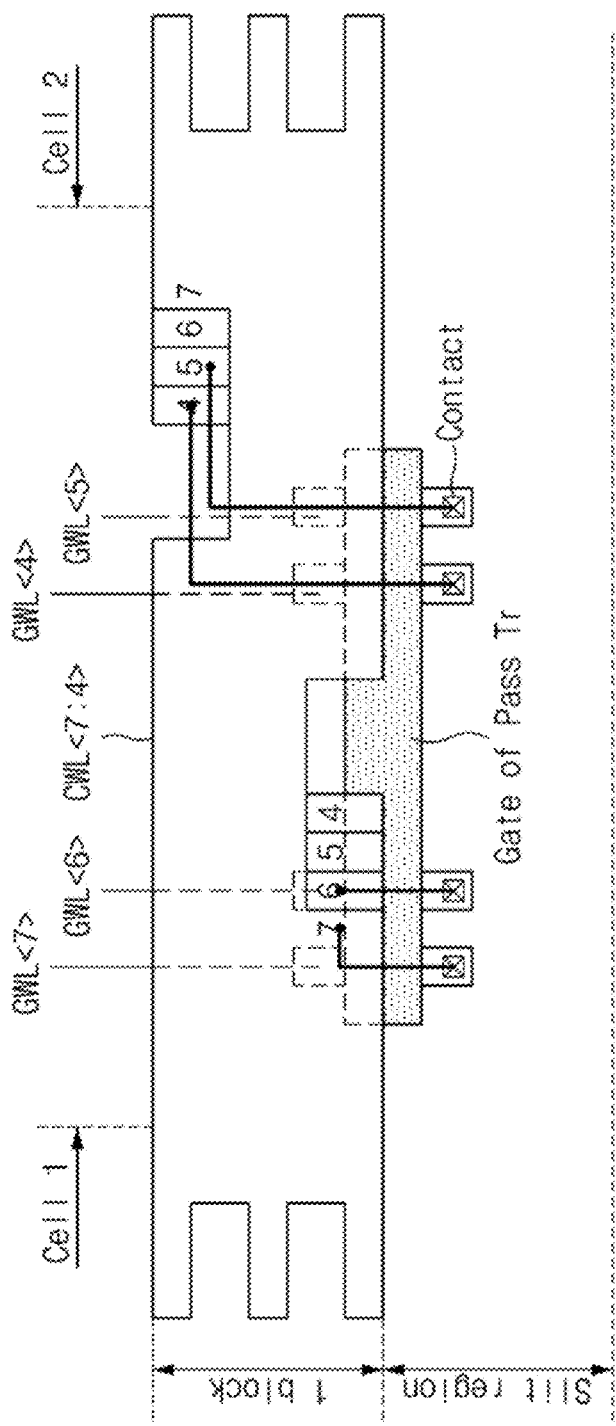
FIG. 5 is a view illustrating a connection relationship between common word lines and pass transistors according to an embodiment of the inventive concept.

FIG. 5 is a view illustrating a connection relationship between common word lines CWL<7:4> and pass transistors according to an embodiment of the inventive concept. Common word lines CWL<7:4> in the embodiment are illustrated to have the same structure as the common word lines CWL<7:4> illustrated in FIG. 2A and FIG. 2B.

Pass transistors Pass Tr for applying programming voltages to the common word lines CWL<7:4> are arranged in a region between cell regions Cell1 and Cell2. The pass transistors Pass Tr may be formed under the common word lines CWL<7:4>. First junction regions such as, source/drain regions, of the pass transistors Pass Tr, which are coupled to the common word lines CWL<7:4>, are not covered with the common word lines CWL<7:4>. Instead, the first junctions are located in a slit region. That is, first junctions of the pass transistors Pass Tr are formed in the slit region. The slit region is formed between the stack of common word lines CWL<7:4> and a neighboring stack of common word lines or adjacent block, and isolates the two stacks from each other.

The pass transistors Pass Tr may be coupled to the common word lines CWL<7:4> exposed in the slim region through contacts as illustrated in FIG. 5. That is, the contacts for electrically coupling the common word lines CWL<7:4> to the pass transistors Pass Tr located below the common word lines CWL<7:4> are arranged in the slit region.

The second junction regions of the pass transistors Pass Tr are coupled to global word lines GWL<7:4>, respectively. The pass transistors Pass Tr are coupled to the global word lines GWL<7:4> based on the block selection signal, and the programming voltages are applied to the common word lines CWL<7:4>.

FIGS. 6 to 11 are process perspective views illustrating a method of forming common word lines according to an embodiment of the inventive concept.

Figure 6:
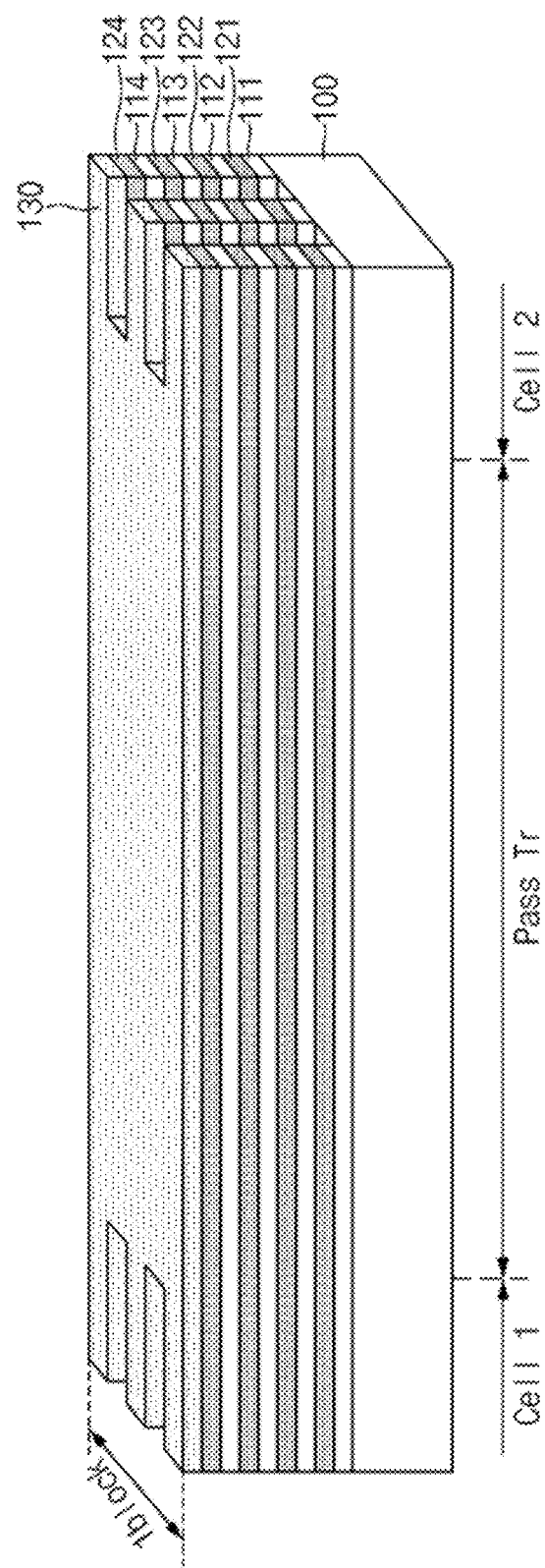
FIGS. 6 to 11 are process views illustrating a method of forming common word lines according to an embodiment of the inventive concept.

Referring to FIG. 6, a plurality of insulating layers 111, 112, 113 and 114 and a plurality of conductive layers 121, 122, 123 and 124 are alternately stacked on a substrate 100 including a bottom structure. For clarity, the embodiment has illustrated that four conductive layers 121, 122, 123 and 124 are stacked, but the number of conductive layers is not limited thereto.

The substrate 100 may be a semiconductor substrate such as a single crystalline substrate, and the bottom structure may include pass transistors. The insulating layers 111 to 114 may be formed of an oxide layer-based material. The conductive layers 121 to 124 may serve as the common word lines, and may include a doped polysilicon layer or a metal layer.

Next, an etch stop layer 130 is formed on the conductive layer 124. Subsequently, the etch stop layer 130, the conductive layers 121 to 124, and the insulating layers 111 to 114 in the cell regions Cell1 and Cell2 are selectively etched, and word lines for forming cell strings are formed in the cell regions Cell1 and Cell2.

At this time, portions of the conductive layers 121 to 124 located in a region between the cell regions Cell1 and Cell2, that is, a region of the substrate 100 such as the pass transistor (Pass Tr) region, in which the pass transistors Pass Tr are formed, are not etched. The conductive layers 121 to 124 are not completely divided into two pieces. Accordingly, each of the conductive layers 121 to 124 forms one body and extends from the cell region Cell1 to the cell region Cell2.

Figure 7:
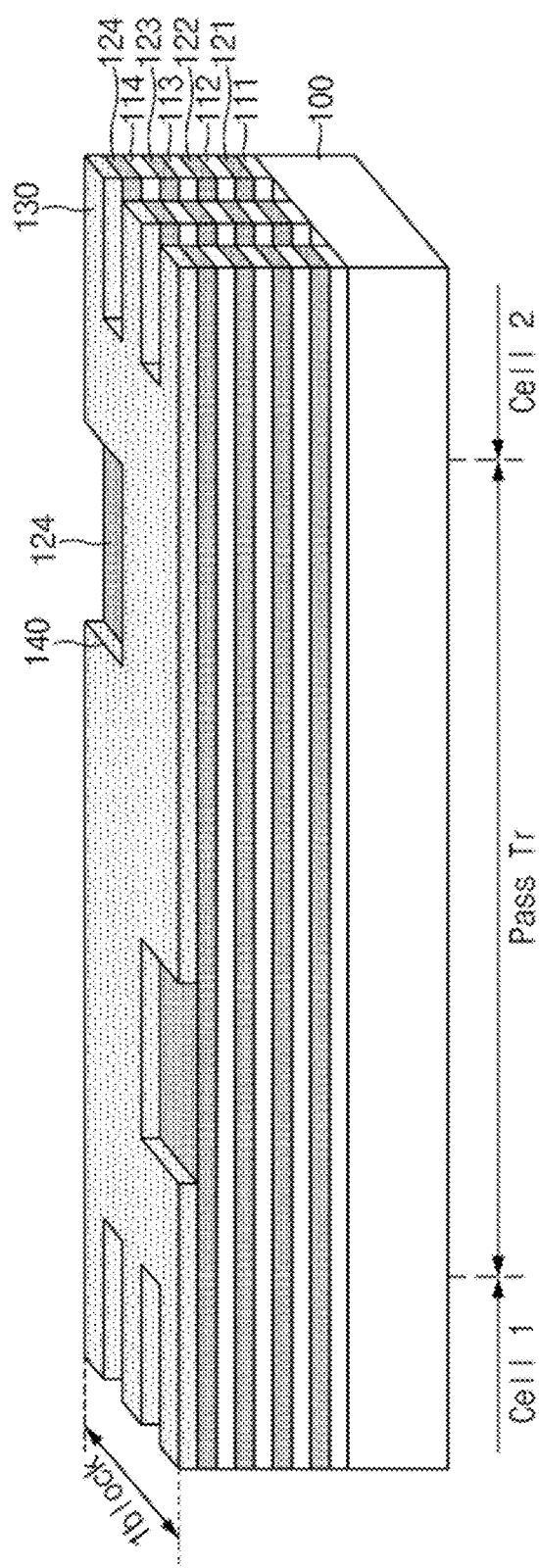

Referring to FIG. 7, the etch stop layer 130 is selectively etched using a slim mask (not shown) until the uppermost conductive layer 124 is exposed in the pass transistor region Pass Tr, thereby defining slim regions 140.

For example, the etch stop layer 130 is removed through an etch process using the slim mask for defining a slim region 140 until the conductive layer 124 in the slim regions 140 is exposed. In a subsequent process, the conductive layers 121 to 124 in the slim region 140 are etched in a stepped manner.

Figure 8:
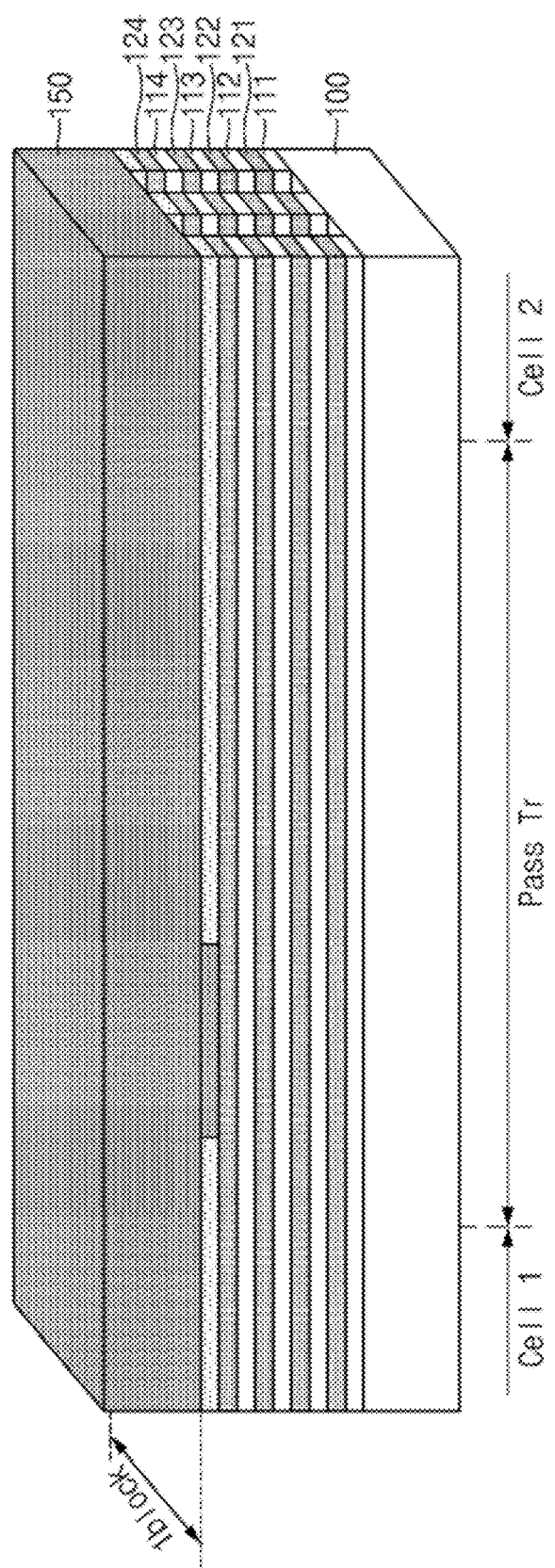

Referring to FIG. 8, a photoresist layer 150 is formed on the conductive layer 124 and the etch stop layer 130 to fill the slim regions 140 (shown in FIG. 7).

The photoresist layer 150 may be formed to a sufficient thickness to provide a process margin to a subsequent etching process and a subsequent sliming etching process. In the subsequent etching process, the conductive layers 121 to 124 and the insulating layers 111 to 114 are etched.

Figure 9:
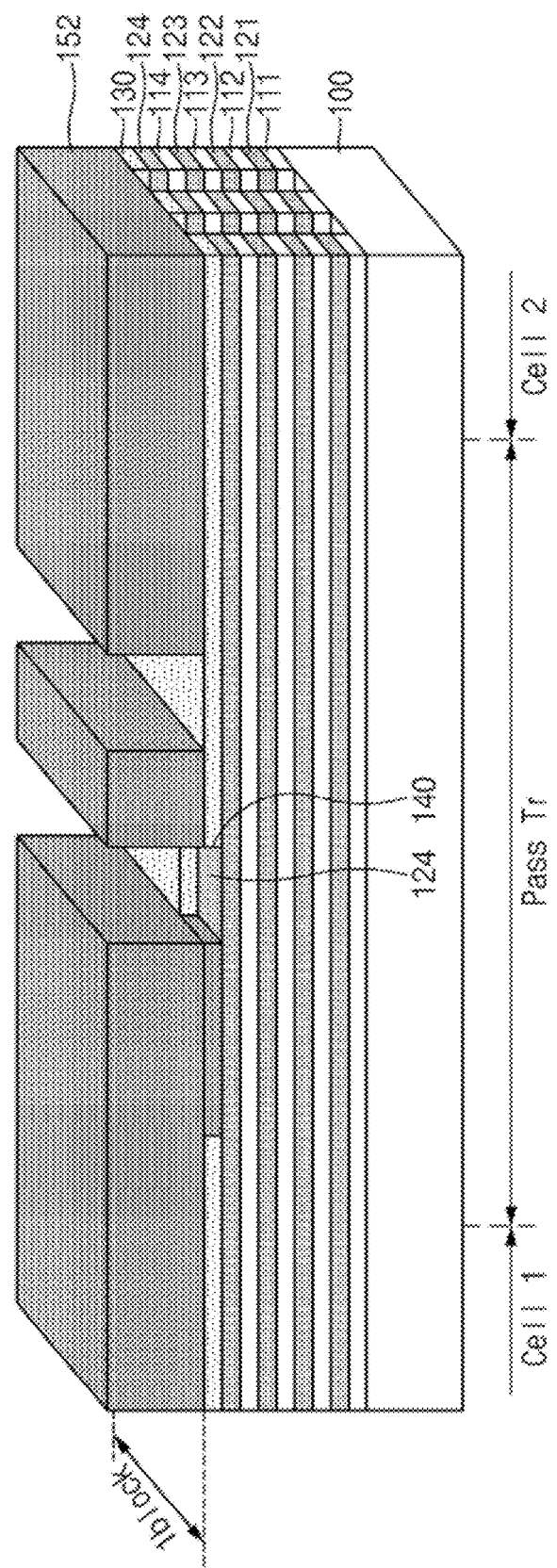

Referring to FIG. 9, an exposure and development process is performed on the photoresist layer 150 (shown in FIG. 8) to form a photoresist pattern 152 exposing a first region of the conductive layer 124. The photoresist pattern 152 defines the slim regions 140. The slim regions 140 are located on a first sidewall of the stack of common word lines CWL. The stack of common word lines CWL includes the conductive layers 121 to 124 and the insulating layers 111 to 114.

Since the etch stop layer 130 is not formed in the slim regions of the pass transistor region Pass Tr, the conductive layer 124 is exposed in the pass transistor region through the photoresist pattern 152. That is, the conductive layer 124 in a region other than the slim regions 140 is not exposed by the etch stop layer 130.

Figure 10:
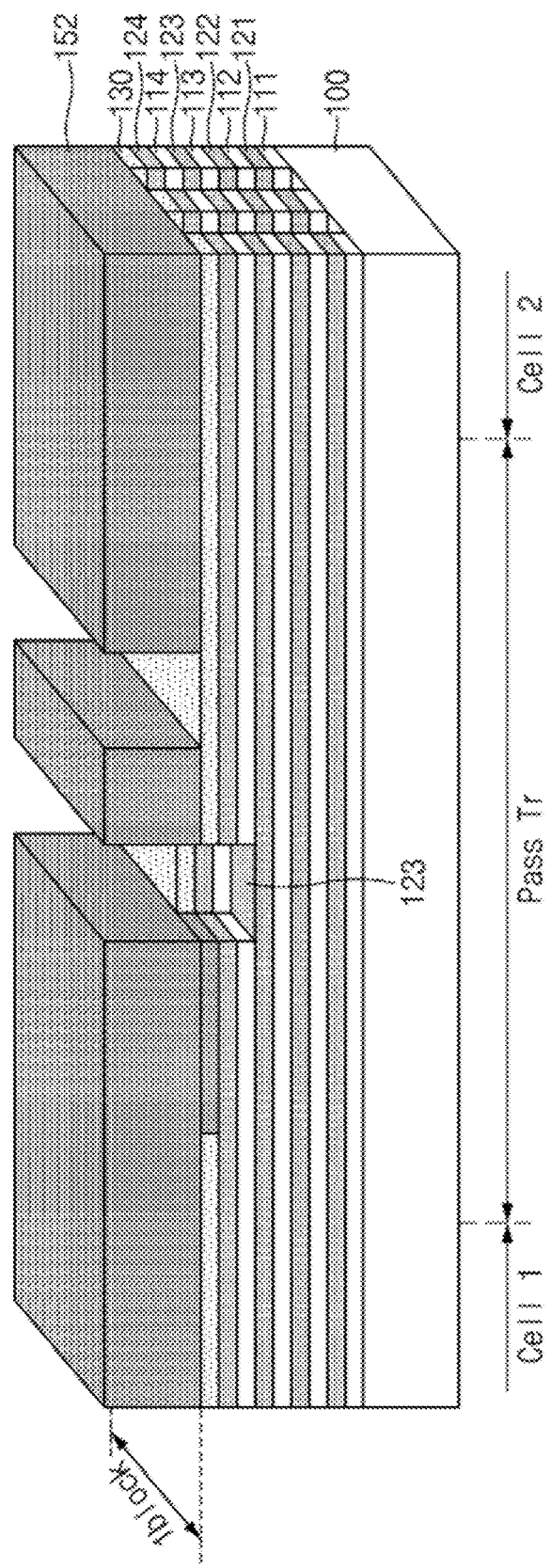

Referring to FIG. 10, the conductive layer 124 and the insulating layer 114 are selectively etched using the photoresist pattern 152 as an etch mask.

Then, the conductive layer 124 and the insulating layer 114 may be etched using different etching gases according to their etch selectivity. Since the conductive layer 124 and the insulating layer 114 are etched using different etching gases according to their etch selectivity, the conductive layer 123 below the insulating layer 114 may not be damaged. Thus, the conductive layer 124 and the insulating layer 114 may be selectively etched. Upon completion of the etching process, a first region of the conductive layer 123 is exposed.

When the etching process is completed, a breakthrough (BT) etching process may be performed. The BT etching process may be a process for removing a residue or polymer generated in a previous etching process.

Figure 11:
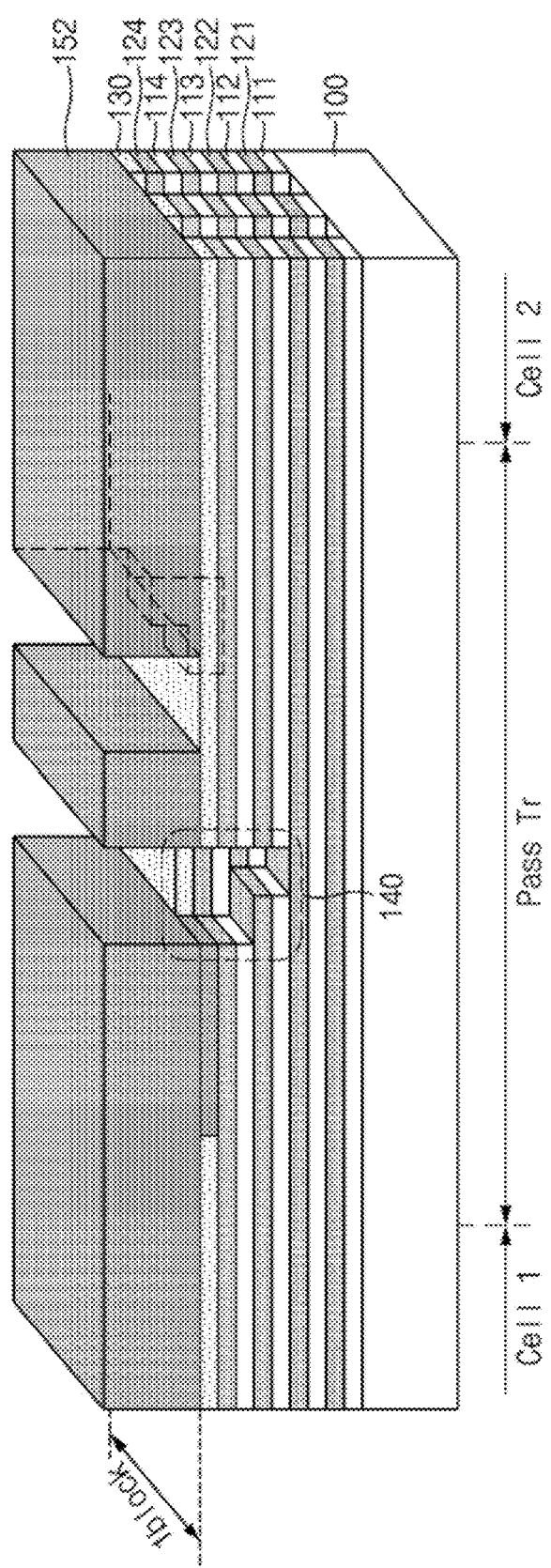

Referring to FIG. 11, a slimming process is performed on the photoresist pattern 152 to reduce a width of the photoresist pattern 152, and thus a second region of the conductive layer 124 is further exposed in the slim regions 140.

Since the size or width, of the photoresist pattern 152 can be freely adjusted according to a slimming process time, the desired width of the photoresist pattern may be obtained through the control of the sliming process time. The slimming process may be performed using a mixture gas of He and $O_2$ or a mixture gas of $H_2$, $O_2$, and $N_2$. Alternatively, the slimming process may be performed by further mixing the mixture gas with $CF_4$ gas.

Subsequently, the conductive layer 124 and the insulating layer 114 therebelow are etched using the slimmed photoresist pattern 152 as an etch mask.

When the second region of the conductive layer 124 and the insulating layer 114 are etched, the first region of the conductive layer 123 which is exposed by the previous etching process and the insulating layer 113, are simultaneously etched. Since the conductive layers 123 and 124 are formed of the same material, the conductive layer 123 exposed in the previous etching process is simultaneously etched when the conductive layer 124 is etched. Similarly, since the insulating layers 113 and 114 are formed of the same material, the insulating layer 113 is simultaneously etched when the insulating layer 114 is etched after the conductive layer 124 is etched. Upon completion of the etching process, a first region of the conductive layer 122 and a second region of the conductive layer 123 are exposed to the slim regions 140.

Thus, the first region of the conductive layer 122 and the second region of the conductive layer 123 form a stepped structure in the slim regions 140.

Subsequently, an additional slimming process for reducing the width of the photoresist pattern 152 by a certain size is repeatedly performed as illustrated in FIG. 11. Then, the conductive layers and the insulating layers are sequentially etched using the repeatedly slimmed photoresist pattern 152. Through the above-described processes, the conductive layers 121 to 124 in the slim regions are formed in a stepped shape as illustrated in FIG. 2.

Furthermore, the method of forming the conductive layer in the stepped shape may use a process of forming the slim region in a stepped shape.

What is claimed is:

1. A three-dimensional (3D) nonvolatile memory device comprising:
    a first cell region;
    a second cell region spaced apart from the first cell region; and
    a stack of common word lines extending from the first cell region to the second cell region and physically connected to the first cell region and the second cell region,
    wherein the stack of common word lines includes N number of common word lines, where N is an integer,
    wherein the stack of common word lines includes a first slim region,
    wherein the first slim region has a stepped structure and is located between the first cell region and the second cell region.

2. The 3D nonvolatile memory device of claim 1, further comprising:
    M number of pass transistors located under the stack of common word lines,
    wherein the pass transistors include a first junction region coupled to the stack of common word lines and a second junction region coupled to a global word line.

3. The 3D nonvolatile memory device of claim 2, wherein the first junction region is located in a slit region and provided between the stack of common word lines and a neighboring stack of common word lines.

4. The 3D nonvolatile memory device of claim 3, further comprising:
    a first contact located in the slit region and configured to electrically couple the first junction region to the $L^{th}$ common word line, where L is an integer and $1 \le L \le N$.

5. The 3D nonvolatile memory device of claim 1,
    wherein X number of common word lines are exposed in the first slim region,
    wherein the X number of common word lines form a stepped structure in the first slim region, and
    where X is an integer and $1 \le X \le N$.

6. The 3D nonvolatile memory device of claim 5,
    wherein the first slim region is located between the first cell region and the second cell region, and the stack of common word lines extends from the first cell region through the first slim region to the second cell region.

7. The 3D nonvolatile memory device of claim 6.
    wherein the stack of common word lines further includes a second slim region,
    wherein the first slim region is located at a first sidewall of the stack of common word lines,
    wherein the second slim region is located at a second sidewall of the stack of common word lines,
    wherein the second sidewall is located opposite to the first sidewall,
    wherein the first cell region is located at a third sidewall of the stack of common word lines,
    wherein the second cell region is located at a fourth sidewall of the stack of common word lines,
    wherein the third sidewall is located opposite to the fourth sidewall,
    wherein the first cell region and the second cell are arranged in a first direction,
    wherein the first slim region and the second slim region are arranged in a second direction, and
    wherein the second direction is different from the first direction.

8. The 3D nonvolatile memory device of claim 7,
    wherein the first slim region is located closer to the first cell region than the second cell region, and
    wherein the second slim region is located between the first cell region and the second cell region, and is closer to the second cell region than the first cell region.

9. The 3D nonvolatile memory device of claim 7,
    wherein Y number of common word lines are exposed in the second slim region, and the Y number of common word lines form a stepped structure in the second slim region, where Y is an integer and $1 \le Y \le N$.

10. The 3D nonvolatile memory device of claim 9,
    wherein N−X=Y, and each of the X number of common word lines and each of the Y number of common word lines are different from each other.

11. The 3D nonvolatile memory device of claim 6,
    wherein the first slim region is located in a first sidewall of the stack of common word lines, and the first slim region includes a plurality of slim regions.

12. The 3D nonvolatile memory device of claim 1,
    wherein the stack of common word lines includes E number of slim regions,
    wherein the N number common word lines are divided into the E number of groups, and
    wherein the E number of groups correspond to the E number of slim regions, respectively, and are exposed by their respective slim regions, where E is an integer and $1 \le E \le N$.

* * * * *